(12) United States Patent
Chien

(10) Patent No.: US 7,245,245 B2
(45) Date of Patent: Jul. 17, 2007

(54) DIGITIZER AND RELATED CHARGE PUMP CIRCUIT

(75) Inventor: Chih-Chang Chien, Taipei Hsien (TW)

(73) Assignee: VIA Technologies Inc., Hsin-Tien, Taipei Hsien (TW)

( * ) Notice: Subject to any disclaimer, the term of this patent is extended or adjusted under 35 U.S.C. 154(b) by 0 days.

(21) Appl. No.: 11/419,506

(22) Filed: May 21, 2006

(65) Prior Publication Data

US 2007/0080837 A1    Apr. 12, 2007

Related U.S. Application Data

(60) Provisional application No. 60/596,668, filed on Oct. 11, 2005.

(51) Int. Cl.
*H03M 1/10* (2006.01)

(52) U.S. Cl. .................. 341/120; 341/118; 327/536

(58) Field of Classification Search ............... 341/118, 341/155, 120; 327/536, 157
See application file for complete search history.

(56) References Cited

U.S. PATENT DOCUMENTS

| | | | | |
|---|---|---|---|---|
| 4,533,863 A * | 8/1985 | Luhn et al. | .............. | 322/28 |
| 5,974,088 A * | 10/1999 | Chang | .............. | 375/244 |
| 6,124,741 A * | 9/2000 | Arcus | .............. | 327/112 |
| 6,525,684 B2 * | 2/2003 | Tsujikawa | .............. | 341/155 |
| 6,847,251 B2 * | 1/2005 | Kao | .............. | 327/536 |
| 6,850,102 B2 * | 2/2005 | Hsu et al. | .............. | 327/157 |
| 6,933,790 B2 * | 8/2005 | Kiyose et al. | .............. | 331/18 |
| 7,106,238 B2 * | 9/2006 | Chiang | .............. | 341/155 |

* cited by examiner

*Primary Examiner*—Peguy JeanPierre
(74) *Attorney, Agent, or Firm*—Winston Hsu

(57) ABSTRACT

A digitizer and a related charge pump are provided. The charge pump includes an input coupled to the output of the comparator and receiving the output of the comparator as a control signal of charging and discharging, three current sources, and three switches, each of which having an end coupled to one of the current sources and another end selectively coupled to one of the differential outputs of the charge pump according to the output signal of the comparator. The charging and discharging currents of the charge pump are essentially identical. Hence there is no need to adopt calibration circuit for calibrating the PN current mismatch.

14 Claims, 7 Drawing Sheets

DIGITIZER AND RELATED CHARGE PUMP CIRCUIT

CROSS REFERENCE TO RELATED APPLICATIONS

The application claims the benefit of U.S. Provisional Application No. 60/596,668, filed Oct. 11, 2005, and included herein by reference.

BACKGROUND OF THE INVENTION

1. Field of the Invention

The present invention relates to a digitizer, and more particularly to a digitizer with a charge pump circuit that has no PN current mismatch.

2. Description of the Prior Art

In read channels of many optical storage systems, such as CD and DVD systems, a data slice circuit for slicing analog signals into digital ones is needed for following process. The data slice circuit, which is called as the digitizer or the data detector briefly, needs to slice analog data accurately at a correct slice level. Otherwise, the error rate of digital data increases, and the performance of the read channel reduces.

According to the specification of these systems, the digital sum value (DSV) of digital signals in the read channels should be minimized to 0. And it is referred to the symmetry of signals. Hence the correct slice level of the digitizer is the slice level at which the digitizer may slice analog data accurately and keep the symmetry of digital signals. However, the dc level of the input analog signals drifts easily and components in the circuit may provide offset in various level. To avoid errors due to the inaccurate slicing, various methods for adjusting the slice level in the read channels are adopted in the prior art.

Please refer to FIG. 1. FIG. 1 is a block diagram of a conventional digitizer 100. The conventional digitizer 100 includes a comparator 110, an inverter 120, a charge pump 130, a pump capacitor 140, and a low pass filter 150. The comparator 110 receives differential analog signals at inputs INP and INN. The output signals of the comparator 110 are sent to other components for following process. Besides, the output signals of the comparator 110 and the inverse output signals of the inverter 120 are sent to the charge pump 130 as the Up and Dn signals respectively. The inverter 120 simply inverses the output signals Up of the comparator 110 to generate the inverse output signals Dn. When the output signal of the comparator 110 is high, the charge pump 130 charges the pump capacitor 140; and when the output signal of the comparator 110 is low, the charge pump 130 discharges the capacitor 140. The output of the charge pump 130 is further coupled to the low pass filter (LPF) 150, so that the voltage at the capacitor 140 is filtered before being fed back to the comparator 110. Furthermore, the comparator 110 receives a reference voltage, Vref, and the filtered output of the LPF 150 to adjust the slice level.

In the conventional digitizer 100, the charge pump 130 of a common structure is adapted to fulfill the feedback loop of slice level calibration. Please refer to FIG. 2. FIG. 2 is a schematic of the charge pump 130 and the pump capacitor 140. As shown in FIG. 2, the charge pump 130 includes a charge current source 131 and a discharge current source 132, of which the current values are Iup1 and Idn1 respectively. The charge current source 131 and the discharge current source 132 are coupled to switches 133 and 134 respectively. The switch 133 is selectively coupled to a loading capacitor 135 or the pump capacitor 140 according to the Up signal received from the comparator 110 (not shown in FIG. 2). Similarly, the switch 134 is selectively coupled to a loading capacitor 135 or the pump capacitor 140 according to the Dn signal, which is the inverse of the Up signal generated by the inverter 120 (not shown in FIG. 2). Since the Up signal and the Dn signal are inverse to each other, the loading capacitor 135 is coupled to either the current sources 131 or 132 at a time, meanwhile the pump capacitor 140 is coupled to the other current sources 132 or 131. In this manner, the charge pump 130 and the pump capacitor 140 together fulfill the loop of reflection of the sum of data level.

However, the charge current source 131 and the charge current source 132 are not physically identical, and the switching speeds of the switches 133 and 134 are different. For example, the two current sources may be composed of PMOS and NMOS independently and hence have different characteristics called PN current mismatches. The switches 133 and 134 are not identical either. Therefore, in consideration of the comparator 110 to output signals at high level and low level equally, the charge current and the discharge current of the pump capacitor 140 may not be equal. Consequently, the voltage fed back to the comparator 110 is not as stable as expected.

There are ways to calibrate the mismatch between the charge current source and the discharge current source of the charge pump adopted in the digitizer. Please refer to FIG. 3. FIG. 3 is a block diagram of a calibration circuit 300 of the prior art. The calibration circuit 300 includes two current sources 331 and 332, which are duplicates of the charge current circuit and the discharge current circuit adapted in the charge pump respectively. A resister 340 is coupled to the joint of the two current sources 331 and 332. Hence the current biasing the resistor 340 is:

$$Im1 = Iup1 - Idn1; \quad \text{eq. (1)}$$

and the voltage at the resistor R is:

$$Vm = Im1 \cdot R \quad \text{eq. (2)}$$

The resistor 340 is further coupled to an analog to digital converter (ADC) 350. The ADC 350 receives the voltage Vm and outputs a corresponding digital signal to a microprocessor 360. The micro-processor 360 generates a control signal Sc in accordance with the input signals from the ADC 350 to adjust the current value of the current source 331 for reducing the current mismatch Im1. The charge current source of the charge pump then can be adjusted according to the control signal Sc as well or according to the adjusted current source 331 of the calibration circuit 300. In this manner, the mismatch between the charge current source and the discharge current source can be decreased.

Described above is the conventional calibration mechanism adopted in charge pumps of digitizers. However, there is a serious drawback in this conventional calibration method. The charge current source 131 and the discharge current source 132 do not function simultaneously in the charge pump circuit 130, and the two current sources 331 and 332 are turned on at the same time while calibrating the mismatch in the calibration circuit 300. That means, the current values of the two current sources 331 and 332 can never be identical to the charge current source 131 and the discharge current source 132. Hence the calibration circuit 300 of the prior art is not able to cancel the current mismatch between current sources of the charge pump exactly.

SUMMARY OF THE INVENTION

The present invention provides a digitizer with a charge pump in which the charge and discharge currents are actually identical.

The digitizer includes a comparator, a charge pump coupled to the comparator and generating two output signals according to a comparing signal of the comparator, a capacitor coupled to the charge pump and being charged/discharged by the charge pump, and a low pass filter coupled to the capacitor for filtering the voltage at the capacitor and feeding back the filtered voltage to the comparator. The charge pump of the present invention includes two output ends, a first current source and a second current source, a first switch coupled to the first current source and selectively coupled to one of the two output ends according to the comparing signal of the comparator, a second switch coupled to the second current source and selectively coupled to one of the two output ends according to the comparing signal of the comparator, a current sink, and a third switch coupled to the current sink and selectively coupled to one of the two output ends according to the comparing signal of the comparator.

The present invention provides a digitizer and a related charge pump wherein the charge current and the discharge current are essentially matched. Without extra calibration circuits, the present invention improves the performance of the charge pump by utilizing a smart and concise differential structure for providing identical charge current and discharge current.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
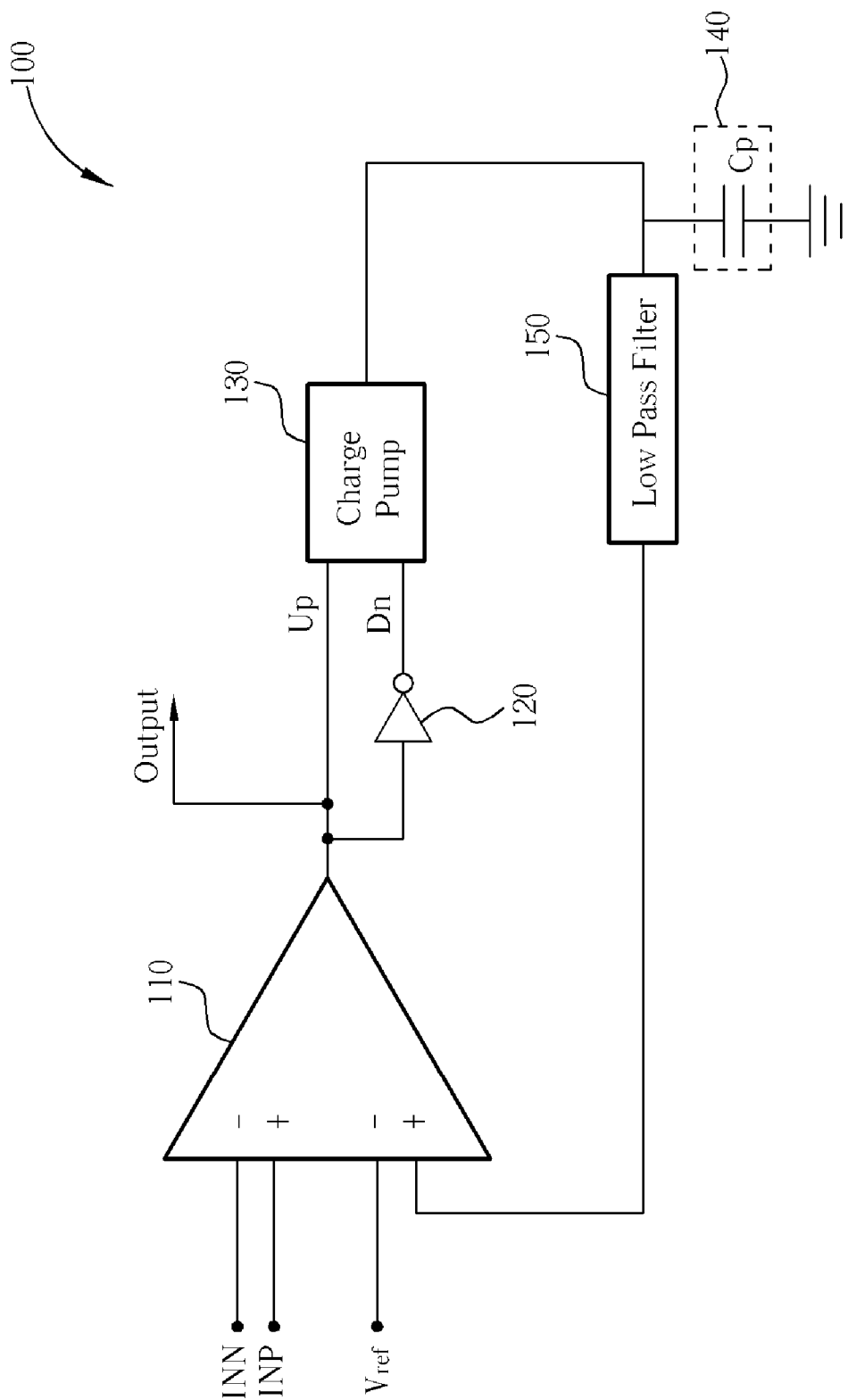
FIG. 1 is a block diagram of a conventional digitizer.
Figure 2:
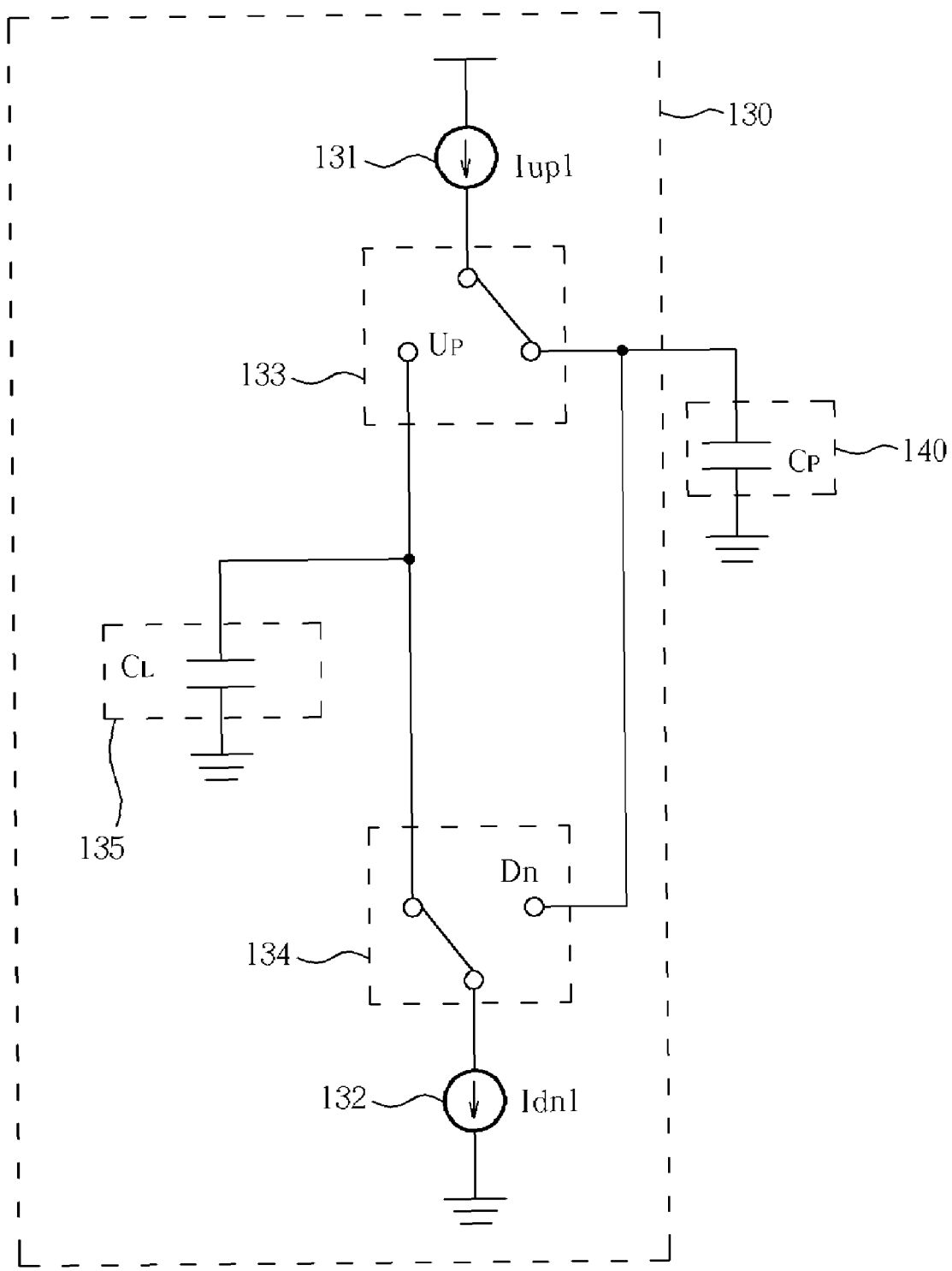
FIG. 2 is a schematic of the conventional charge pump and the pump capacitor.
Figure 3:
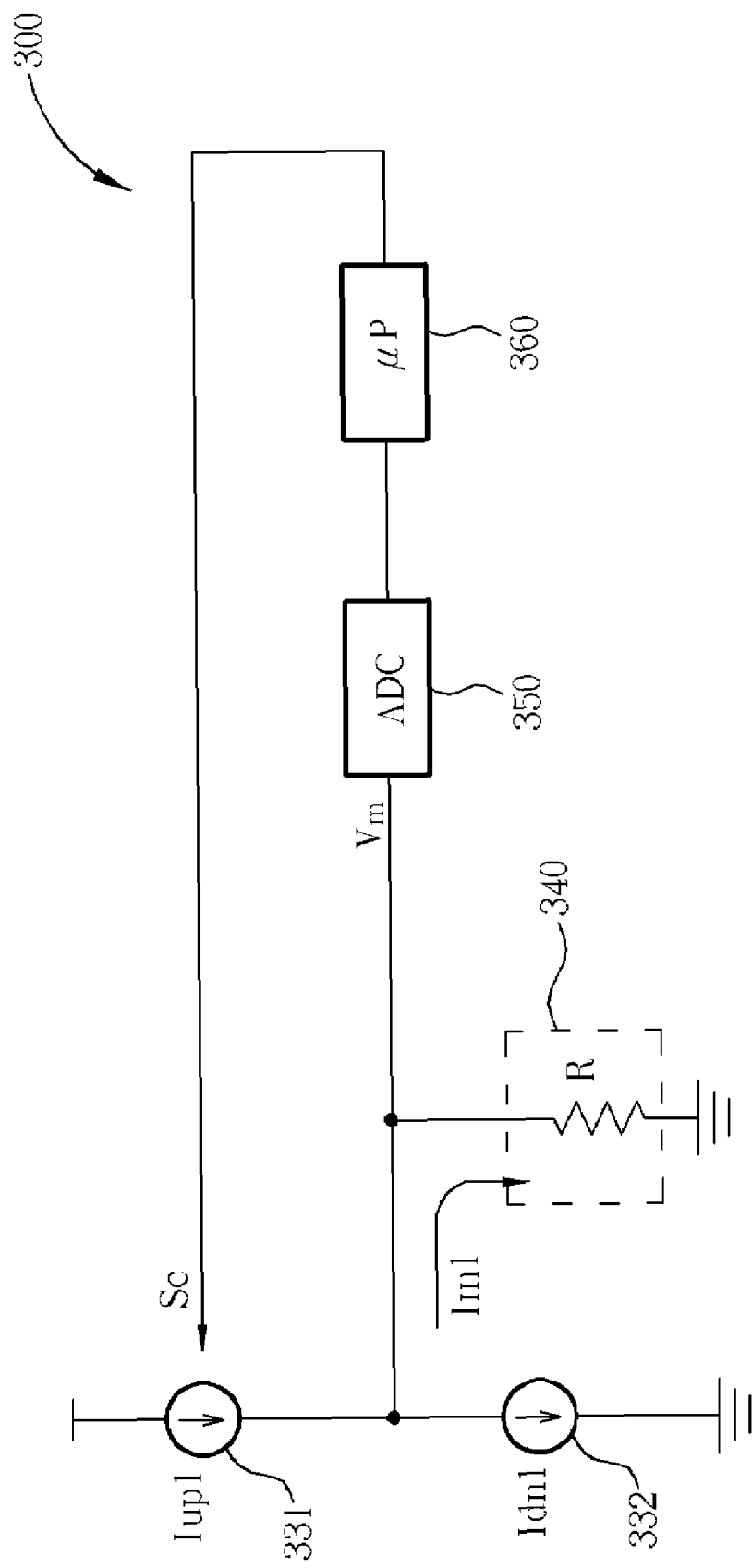
FIG. 3 is a block diagram of a calibration circuit of the prior art.
Figure 4:
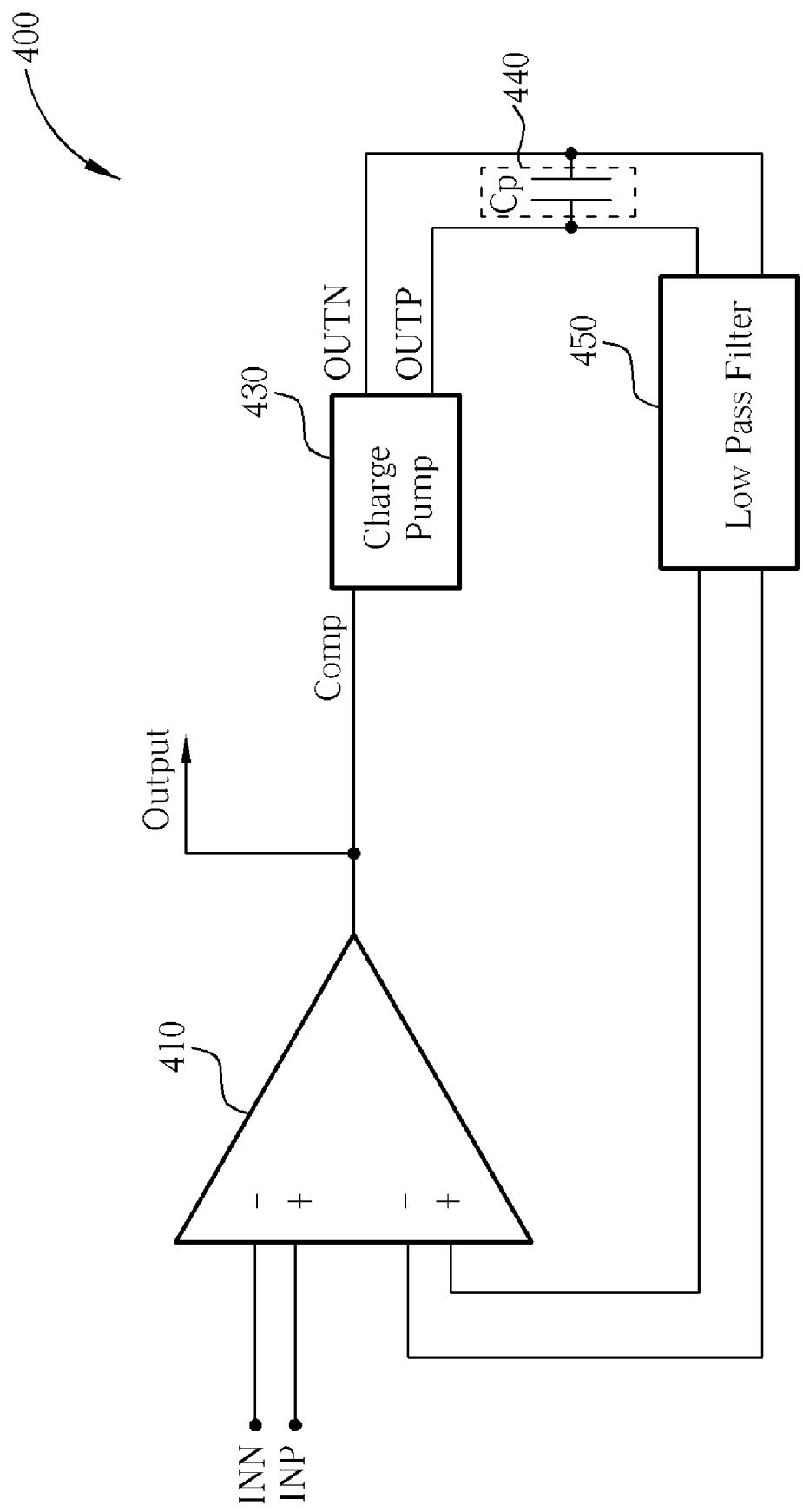
FIG. 4 is a block diagram of a digitizer of the present invention.

In the present invention, a digitizer with a charge pump having no PN current mismatch is disclosed. Please refer to FIG. 4. FIG. 4 is a block diagram of a digitizer 400 of the present invention. The digitizer 400 includes a comparator 410, a charge pump 430, a pump capacitor 440, and a low pass filter 450. The comparator 410 receives differential analog signals at inputs INP and INN, and outputs digital signals to other components for following process. The output signal Comp of the comparator 410 is further coupled to the charge pump 430 for controlling the charge current and the discharge current of the pump capacitor 440. As illustrated in FIG. 4, the charge pump 430 is differentially coupled to the pump capacitor 440 and the low pass filter 450. When the output signal Comp of the comparator 410 is high, the charge pump 430 charges the pump capacitor 440; and when the output signal Comp of the comparator 410 is low, the charge pump 430 discharges the pump capacitor 440. The voltage across the pump capacitor 440 is filtered by the low pass filter 450 before being fed back to the comparator 410. Furthermore, the comparator 410 receives the filtered voltage from the low pass filter 450 to adjust a slice level of the output signal Comp of the comparator 410.

When an analog voltage potential of the analog inputs of the comparator 410 is higher than a digital voltage potential of the digital outputs of the comparator 410, then the output signal Comp of the comparator 410 is high. When the analog voltage potential of the analog inputs of the comparator 410 is lower than the digital voltage potential of the digital outputs of the comparator 410, then the output signal Comp of the comparator 410 is low.

Figure 5:
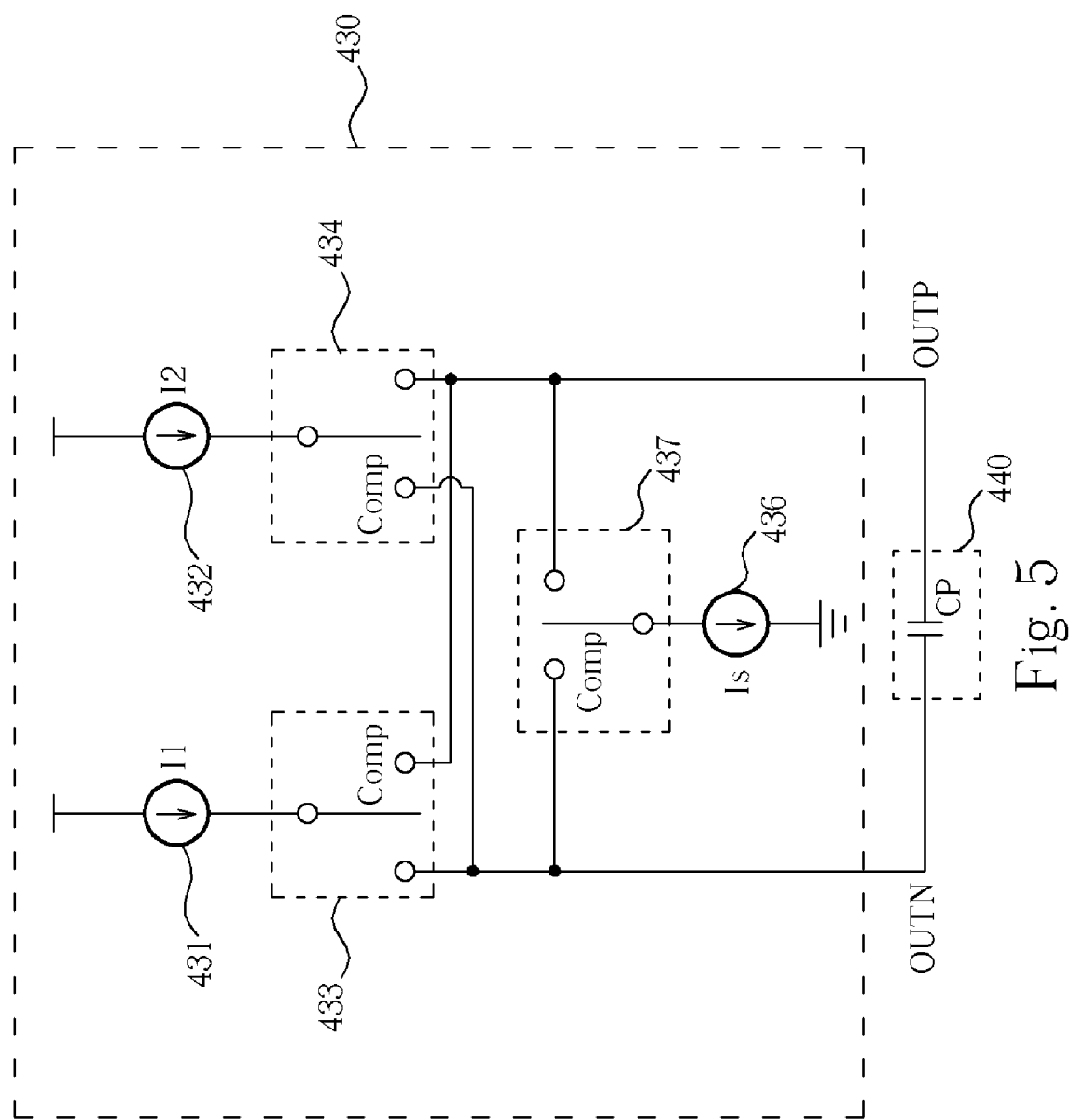
FIG. 5 is a schematic of a charge pump of the present invention coupled with a pump capacitor.

In the present invention, there is no need to include any calibration circuit for the charge pump 430 because the charge current and the discharge current are essentially equal. Please refer to FIG. 5. FIG. 5 is a schematic of a charge pump 430 of the present invention coupled with a pump capacitor 440. The charge pump 430 includes three current sources 431, 432 and 436, and three switches 433, 434 and 437. The current values of the three current sources 431, 432 and 436 are I1, I2 and Is respectively. The three switches 433, 434 and 437 are controlled by the same signal, Comp, from the comparator 410 (not shown in FIG. 5). Each of the three switches 433, 434 and 437 is coupled to one of the three current sources 431, 432 and 436 respectively, and selectively coupled to either of the differential output ends of the charge pump 430.

Figure 6:
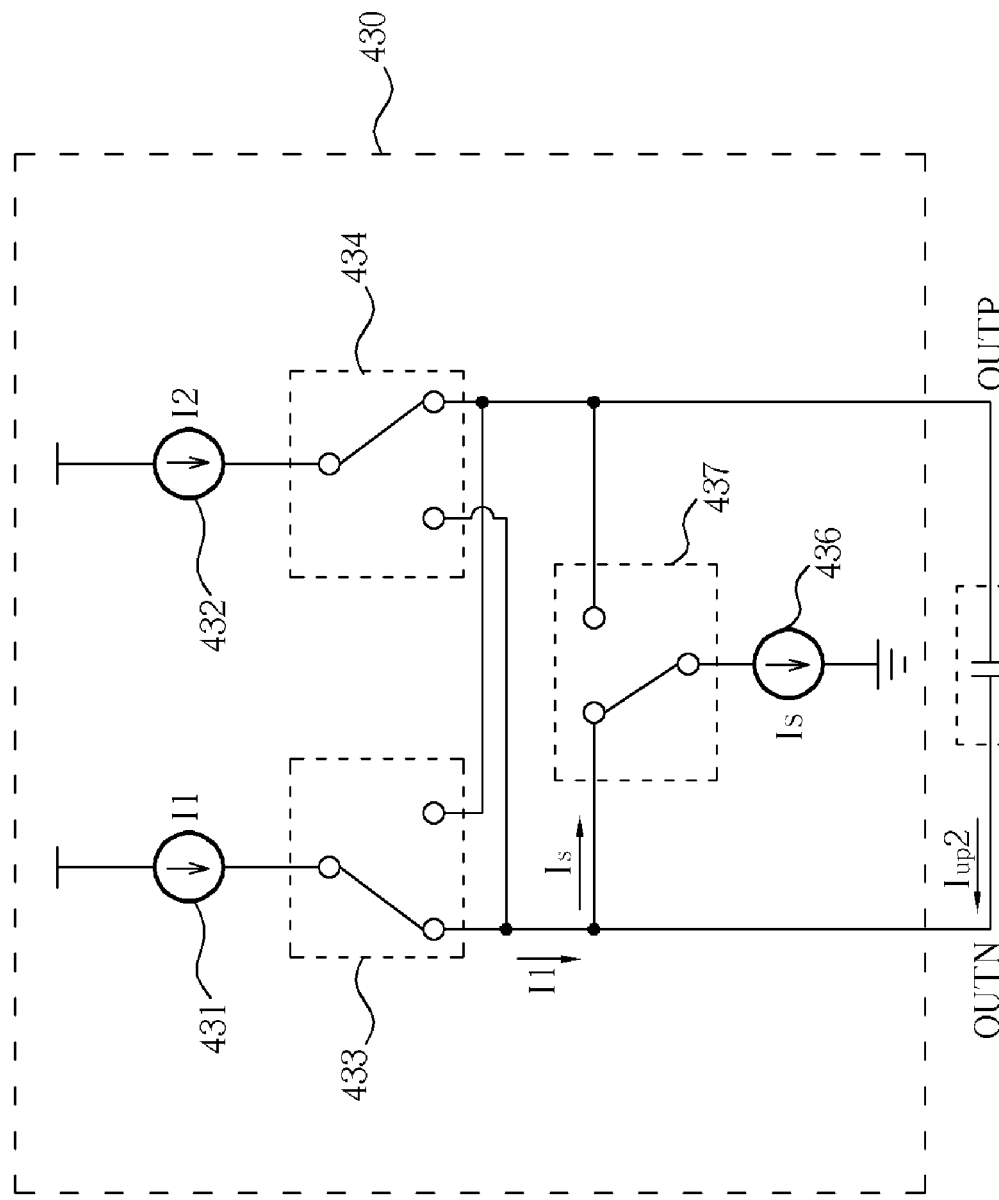
FIG. 6 is a schematic of the charge pump coupled with the pump capacitor when the charge pump receives a high signal.

Please refer to FIG. 6. FIG. 6 is a schematic of the charge pump 430 coupled with the pump capacitor 440 when the charge pump 430 receives a high Comp signal. The switch 433 is switched to the output OUTN, the switch 434 is switched to the output OUTP, and the switch 437 is switched to the output OUTN. As shown in FIG. 6, the current Iup2 charging the pump capacitor 440 is:

$$I\text{up}2 = Is - I1 \qquad \text{eq. (3)}$$

Figure 7:
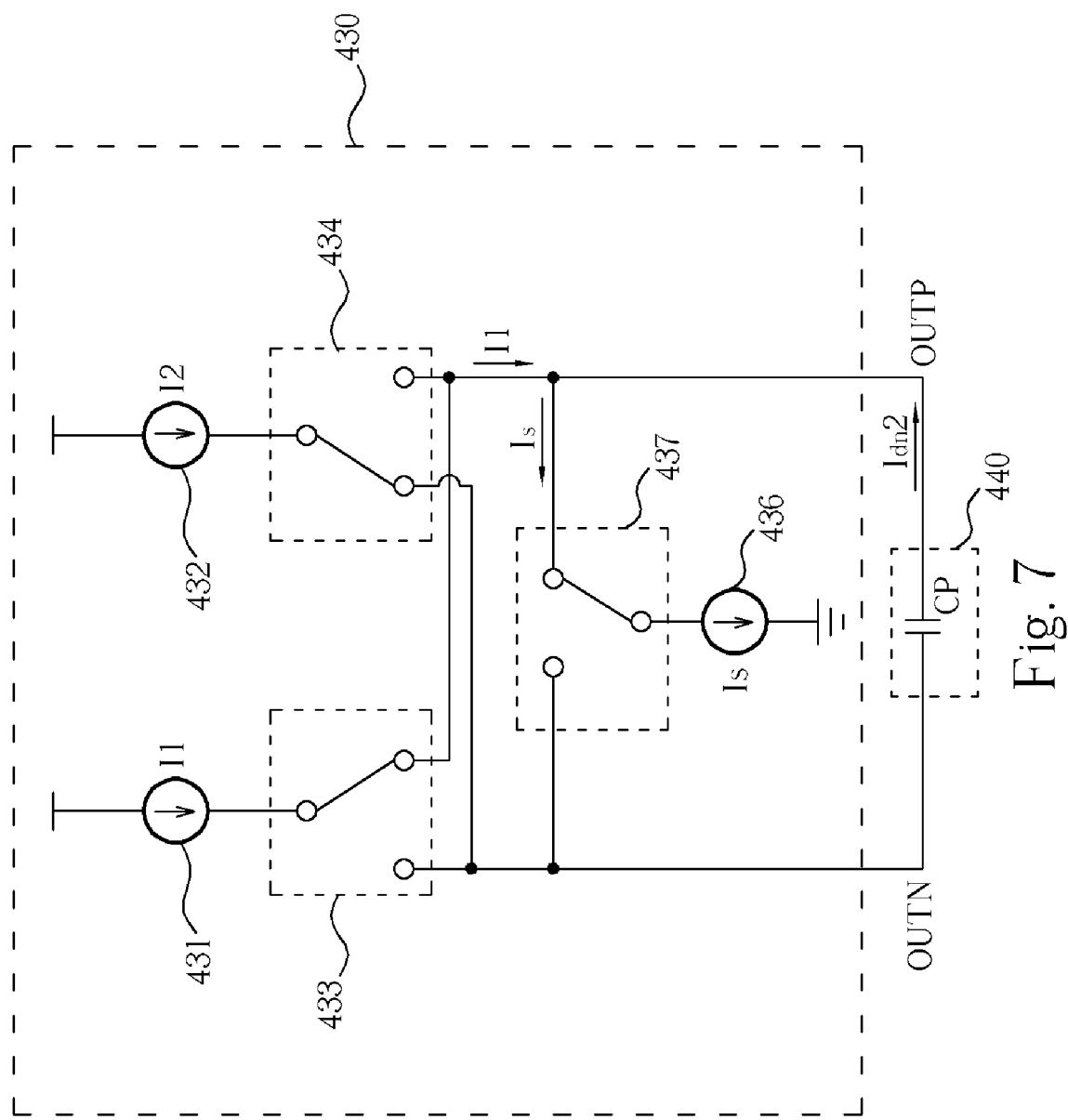
FIG. 7 is a schematic of the charge pump coupled with the pump capacitor when the charge pump receives a low signal.

However, the three switches 431, 432 and 437 change the connections oppositely while receiving a low Comp signal. Please refer to FIG. 7. FIG. 7 is a schematic of the charge pump 430 coupled with the pump capacitor 440 when the charge pump 430 receives a low Comp signal. The switch 433 is switched to the output OUTP, the switch 434 is switched to the output OUTN, and the switch 437 is switched to the output OUTP. Same as illustrated in FIG. 6, the current Idn2 discharging the pump capacitor 440 is:

$$I\text{dn}2 = Is - I1 \qquad \text{eq. (4)}$$

According to eq. (3) and eq. (4), it is obvious to observe that the charging current Iup2 and the discharging current Idn2 are just identical in current value, regardless of any variation of fabrication. That is, there is no current mismatch in the charge pump 430 of the present invention. Therefore, there is no need to adopt any calibration circuit for matching charge current and discharge current. Besides, since the charge pump 430 of the present invention shown in FIG. 4 to FIG. 7 is constructed in differential structure, no matter the charge pump 430 of the present invention receives a high Comp signal or a low Comp signal, all the three switches are switched. Therefore the switching speeds are absolutely the same when charging the pump capacitor 440 and when discharging the pump capacitor 440.

In summary, the present invention discloses a digitizer and a related charge pump utilized in systems requiring substantially 0 DSV (digital sum value), wherein there is no mismatch between the charge current and the discharge current of the charge pump. Without extra calibration circuits, the present invention improves the performance of the charge pump by utilizing a smart and concise differential structure circuit. The area of the differential structure circuit is reduced, and the performance of the charge pump is improved. Hence the symmetry of data (DSV=0) is achieved in the digitizer and the related charge pump of the present invention. It is proved that when the frequency of input digital signals of the charge pump is as high as 70 MHz, and the value of the charge current and the discharge current is designed to be 2.5 uA, the mismatch between the charge current and the discharge current in the charge pump of the present invention is less then 1%, while it is larger than 10% in the conventional charge pumps.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digitizer without a current mismatch, comprising:
   a comparator, receiving two analog inputs and two digital outputs to adjust a slice level for slicing a plurality of analog data and generating a comparing signal;
   a charge pump circuit, receiving said comparing signal of said comparator and generating a first output signal at a first output end and a second output signal at a second output end, comprising:
   a first current source, providing current to said first output end or said second output end;
      a first switch, selectively switching said first current source according to said comparing signal of said comparator;
      a second current source, providing current to said first output end or said second output end;
      a second switch, selectively switching said second current source according to said comparing signal of said comparator;
      a current sink, providing current to said first output end or said second output end; and
      a third switch, selectively switching said current sink according to said comparing signal of said comparator;
   a capacitor, coupled between said first output end and said second output end of said charge pump circuit; and
   a low pass filter, receiving said first output signal and said second output signal of said charge pump circuit to generate said two digital outputs to said comparator.

2. The digitizer of claim 1, wherein said first switch is coupled to said first output end, said second switch is coupled to said second output end, and said third switch is coupled to said first output end when said comparing signal of said comparator is in a first voltage level.

3. The digitizer of claim 1, wherein said first switch is coupled to said second output end, said second switch is coupled to said first output end, and said third switch is coupled to said second output end when said comparing signal of said comparator is in a second voltage level.

4. The digitizer of claim 1, wherein said charge pump circuit and said low pass filter are in differential form.

5. The digitizer of claim 1, wherein said charge pump circuit charges said capacitor when said comparing signal of said comparator is in a first voltage level; and said charge pump circuit discharges said capacitor when said comparing signal of said comparator is in a second voltage level.

6. The digitizer of claim 5, wherein said comparing signal of said comparator is in the first voltage level when an analog voltage potential of said analog inputs of said comparator is higher than a digital voltage potential of said digital outputs of said comparator.

7. The digitizer of claim 5, wherein said comparing signal of said comparator is in the second voltage level when said voltage potential of said analog inputs of said comparator is lower than said digital voltage potential of said digital outputs of said comparator.

8. The digitizer of claim 5, wherein said capacitor has substantially same current value while being charged and discharged.

9. A charge pump circuit coupled to a capacitor, receiving an input signal to generate a first output signal at a first output end and a second output signal at a second output end, comprising:
   a first current source, providing current to said first output end or said second output end;
   a first switch, selectively switching said first current source according to said input signal of said comparator;
   a second current source, providing current to said first output end or said second output end;
   a second switch, selectively switching said second current source according to said input signal of said comparator;
   a current sink, providing current to said first output end or said second output end; and
   a third switch, selectively switching said current sink according to said input signal of said comparator.

10. The charge pump circuit of claim 9, wherein said first switch is coupled to said first output end, said second switch is coupled to said second output end, and said third switch is coupled to said first output end when said input signal of said comparator is in a first voltage level.

11. The charge pump circuit of claim 9, wherein said first switch is coupled to said second output end, said second switch is coupled to said first output, and said third switch is coupled to said second output end when said input signal of said comparator is in a second voltage level.

12. The charge pump circuit of claim 9, wherein said capacitor is charged by said charge pump circuit when said input signal is in a first voltage level; said capacitor is discharged by said charge pump circuit when said input signal is in a second voltage level.

13. The charge pump circuit of claim 12, wherein said capacitor has identical charge and discharge current.

14. The charge pump circuit of claim 9, wherein said capacitor is coupled between said first output end and said second output end of said charge pump circuit.

* * * * *